US012597582B2

(12) United States Patent　　　(10) Patent No.:　US 12,597,582 B2
Tsutsumi et al.　　　　　　　　　(45) Date of Patent:　　Apr. 7, 2026

(54) CHARGED PARTICLE BEAM APPARATUS

(71) Applicant: JEOL Ltd., Tokyo (JP)

(72) Inventors: Kenichi Tsutsumi, Tokyo (JP); Tatsuya Uchida, Tokyo (JP); Kazushiro Yokouchi, Tokyo (JP); Nobuyuki Ikeo, Tokyo (JP); Konomi Ikita, Tokyo (JP)

(73) Assignee: JEOL Ltd., Tokyo (JP)

( * ) Notice: Subject to any disclaimer, the term of this patent is extended or adjusted under 35 U.S.C. 154(b) by 488 days.

(21) Appl. No.: 18/121,289

(22) Filed: Mar. 14, 2023

(65) Prior Publication Data

US 2023/0307206 A1　　Sep. 28, 2023

(30) Foreign Application Priority Data

Mar. 23, 2022　(JP) ................................. 2022-047000

(51) Int. Cl.
*H01J 37/22*　　　(2006.01)
*H01J 37/147*　　(2006.01)
(Continued)

(52) U.S. Cl.
CPC ........ *H01J 37/222* (2013.01); *H01J 37/1474* (2013.01); *H01J 37/26* (2013.01);
(Continued)

(58) Field of Classification Search
CPC ...... H01J 37/222; H01J 37/1474; H01J 37/26; H01J 37/244; H01J 2237/24578; H01J 2237/2511
See application file for complete search history.

(56) References Cited

U.S. PATENT DOCUMENTS

2002/0096645 A1　7/2002　Kawakami
2009/0218488 A1　9/2009　Wells
(Continued)

FOREIGN PATENT DOCUMENTS

JP　　2000133567 A　　5/2000
JP　　2002286663 A　　10/2002
(Continued)

OTHER PUBLICATIONS

Office Action issued in JP2022047000 on Feb. 6, 2024.
Extended European Search Report issued in EP23158446.7 on Jul. 28, 2023.

*Primary Examiner* — Michael J Logie
*Assistant Examiner* — Hanway Chang
(74) *Attorney, Agent, or Firm* — The Webb Law Firm

(57) ABSTRACT

A charged particle beam apparatus that forms a probe with a charged particle beam and scans a specimen with the probe to acquire a scanning image. The charged particle beam apparatus includes an optical system for scanning the specimen with the probe; a detector that detects a signal generated from the specimen through the scanning of the specimen with the probe; and a control unit that controls the optical system. The control unit performs correction processing of acquiring a reference image obtained by the scanning of the specimen with the probe, comparing the reference image to a criterion image to determine a drift amount, and correcting a displacement of an irradiation position with the probe on the specimen based on the drift amount; and processing of setting a frequency with which the correction processing is to be performed based on the drift amount.

5 Claims, 4 Drawing Sheets

(51) Int. Cl.
　　*H01J 37/244*　　　　(2006.01)
　　*H01J 37/26*　　　　(2006.01)

(52) U.S. Cl.
　　CPC ... *H01J 37/244* (2013.01); *H01J 2237/24578*
　　　　　　(2013.01); *H01J 2237/2511* (2013.01)

(56)　　　　　References Cited

U.S. PATENT DOCUMENTS

| | | | | |
|---|---|---|---|---|
| 2012/0104253 | A1 | 5/2012 | Tsuneta et al. | |
| 2015/0270101 | A1 | 9/2015 | Izuka | |
| 2016/0019696 | A1* | 1/2016 | Morita .................. | H01J 37/222 |
| | | | | 348/80 |
| 2023/0402252 | A1* | 12/2023 | Ikeo .................... | H01J 37/3045 |

FOREIGN PATENT DOCUMENTS

| | | | |
|---|---|---|---|
| JP | 201776559 | A | 4/2017 |
| WO | 2011007492 | A1 | 1/2011 |

* cited by examiner

CHARGED PARTICLE BEAM APPARATUS

CROSS-REFERENCE TO RELATED APPLICATION

This application claims priority to Japanese Patent Application No. 2022-047000, filed Mar. 23, 2022, the disclosure of which is hereby incorporated by reference in its entirety.

BACKGROUND OF THE INVENTION

Field of the Invention

The present invention relates to a charged particle beam apparatus.

Description of Related Art

As a charged particle beam apparatus that scans a specimen with an electron probe to acquire a scanning image, a scanning electron microscope (SEM), a scanning transmission electron microscope (STEM), an electron probe microanalyzer (EPMA), an Auger electron microscope (Auger), or the like is known.

In such a charged particle beam apparatus, due to heat generated in a region of the specimen irradiated with the electron probe, temperature unevenness around the region, or the like, the specimen may drift. In addition, due to a temperature change in an optical system or the like, an electron probe irradiation position may drift. When relative positions of the electron probe and the specimen fluctuate with time, the scanning image cannot be acquired with high positional accuracy. Accordingly, for a charged particle beam apparatus capable of observation and analysis at a high magnification of 100,000-fold or more, a function of correcting the electron probe irradiation position is indispensable.

For example, JP-A-2017-76559 discloses an electron probe microanalyzer capable of correcting an electron beam scanning position. In the electron probe microanalyzer disclosed in JP-A-2017-76559, a secondary electron image acquired in conjunction with an X-ray image (element map) is compared to a criterion image serving as a correction criterion and, when there is a deviation between the two images, the electron beam scanning position is corrected so as to correct the deviation.

A frequency with which the electron probe irradiation position is to be corrected is generally set by a user based on previous experiment or the like. However, a drift of the specimen and stability of the optical system cannot precisely be predicted before analysis is started, and consequently it is difficult for the user to appropriately set the frequency with which the electron probe irradiation position is to be corrected.

SUMMARY OF THE INVENTION

According to an aspect of the present disclosure, there is provided a charged particle beam apparatus that forms a probe with a charged particle beam and scans a specimen with the probe to acquire a scanning image, the charged particle beam apparatus including:

an optical system for scanning the specimen with the probe;

a detector that detects a signal generated from the specimen through the scanning of the specimen with the probe; and a control unit that controls the optical system, the control unit performing:

correction processing of acquiring a reference image obtained by the scanning of the specimen with the probe, comparing the reference image to a criterion image to determine a drift amount, and correcting a displacement of an irradiation position with the probe on the specimen based on the drift amount; and processing of setting a frequency with which the correction processing is to be performed, based on the drift amount.

DESCRIPTION OF THE INVENTION

According to an embodiment of the present disclosure, there is provided a charged particle beam apparatus that forms a probe with a charged particle beam and scans a specimen with the probe to acquire a scanning image, the charged particle beam apparatus including:

an optical system for scanning the specimen with the probe;

a detector that detects a signal generated from the specimen through the scanning of the specimen with the probe; and a control unit that controls the optical system, the control unit performing:

correction processing of acquiring a reference image obtained by the scanning of the specimen with the probe, comparing the reference image to a criterion image to determine a drift amount, and correcting a displacement of an irradiation position with the probe on the specimen based on the drift amount; and processing of setting a frequency with which the correction processing is to be performed, based on the drift amount.

In such a charged particle beam apparatus, the control unit sets the frequency of the correction processing based on the drift amount, and therefore it is possible to appropriately set the frequency of the correction processing.

Preferred embodiments of the invention will now be described in detail with reference to the drawings. It is noted that the following embodiments described below do not unduly limit the scope of the invention as stated in the claims. Further, all of the components described in the following embodiments are not necessarily essential requirements of the invention.

1. First Embodiment

1.1. Auger Electron Microscope

Figure 1:
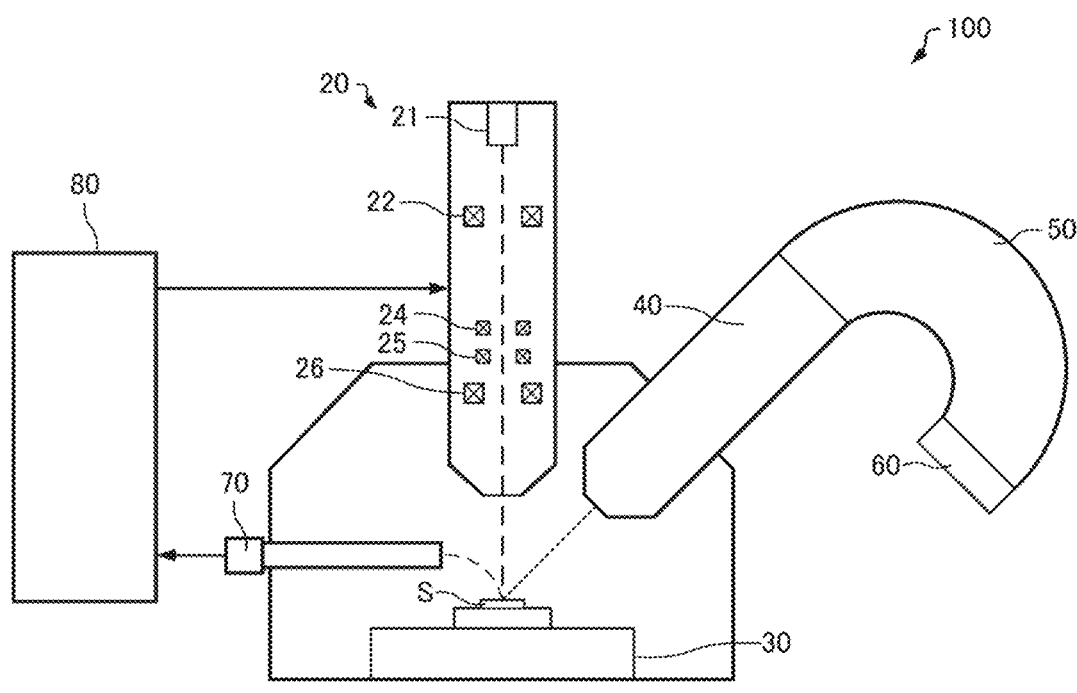
FIG. 1 is a diagram illustrating a configuration of an Auger electron microscope according to the first embodiment.

Referring to the drawings, a description will be given first of the Auger electron microscope according to the first embodiment. FIG. 1 is a diagram illustrating a configuration of an Auger electron microscope 100 according to the first embodiment.

The Auger electron microscope 100 performs measurement based on Auger electron spectroscopy. The Auger electron spectroscopy is a technique of measuring energy of Auger electrons excited by an electron beam or the like and emitted from a specimen to perform elemental analysis.

As illustrated in FIG. 1, the Auger electron microscope 100 includes an optical system 20, a specimen stage 30, an input lens 40, an electron analyzer 50, an Auger electron detector 60, a secondary electron detector 70, and a control unit 80.

The optical system 20 is an electrooptical system that forms a probe with an electron beam and scans a specimen S with the probe. The optical system 20 includes an electron source 21, a condenser lens 22, a deflector 24, a scanning deflector 25, and an objective lens 26.

An electron source 21 emits an electron beam. The electron source 21 is, e.g., an electron gun that accelerates electrons emitted from a cathode with an acceleration voltage applied between the cathode and an anode to emit the electron beam.

The condenser lens 22 and the objective lens 26 focus the electron beam emitted from the electron source 21 to form the electron probe. The scanning deflector 25 two-dimensionally deflects the electron beam focused by the condenser lens 22 and the objective lens 26. Through the two-dimensional deflection of the electron beam by the scanning deflector 25, the specimen S can be scanned with the electron probe. The deflector 24 two-dimensionally deflects the focused electron beam. The deflector 24 is used for, e.g., image shift which electromagnetically moves a viewing field of the scanning image.

The specimen stage 30 holds the specimen S. The specimen stage 30 includes, e.g., a horizontal movement mechanism that horizontally moves the specimen S, a height direction movement mechanism that moves the specimen S in a height direction, and a tilt mechanism that tilts the specimen S. The specimen stage 30 allows the specimen S to be positioned.

The input lens 40 retrieves the Auger electrons emitted from the specimen S through the irradiation of the specimen S with the electron beam, and guides the Auger electrons to the electron analyzer 50. For example, by decelerating the electrons with the input lens 40, it is possible to vary energy resolving power.

The electron analyzer 50 analyzes the Auger electrons. The electron analyzer 50 is, e.g., an electrostatic hemispherical analyzer. The electron analyzer 50 has an inner hemispherical electrode and an outer hemispherical electrode. In the electron analyzer 50, a voltage is applied between the inner hemispherical electrode and the outer hemispherical electrode to allow the Auger electrons in an energy range corresponding to the applied voltage to be retrieved. The Auger electron detector 60 detects the Auger electrons analyzed by the electron analyzer 50.

By counting the number of the Auger electrons detected by the Auger electron detector 60 on a per energy basis, it is possible to obtain an Auger spectrum. Additionally, by scanning the specimen S with the electron probe and measuring a quantity of the Auger electrons at each point on the specimen S, it is possible to obtain an Auger image.

The secondary electron detector 70 detects secondary electrons emitted from the specimen S through the irradiation of the specimen S with the electron beam. By scanning the specimen S with the electron probe and measuring a quantity of the secondary electrons at each point on the specimen S, it is possible to obtain a secondary electron image.

Note that the Auger electron microscope 100 may also include a backscattered electron detector that detects backscattered electrons emitted from the specimen S through the irradiation of the specimen S with the electron beam, though not shown. By scanning the specimen S with the electron probe and measuring a quantity of the backscattered electrons at each point on the specimen S, it is possible to obtain a backscattered electron image.

The control unit 80 controls the optical system 20 of the Auger electron microscope 100. The control unit 80 includes, e.g., a processor such as a CPU (Central Processing Unit) or a DSP (Digital Signal Processor) and a storage device (such as a RAM (Random Access Memory) or a ROM (Read Only Memory)). In the control unit 80, the processor executes a program stored in the storage device to perform various calculation processing and various control processing.

Figure 2:
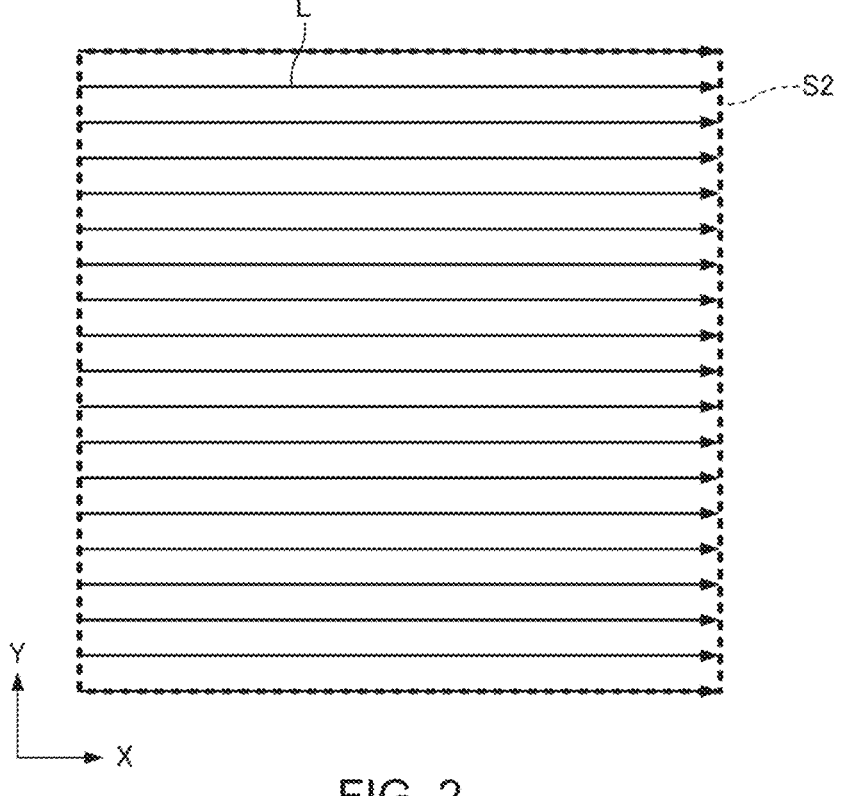
FIG. 2 is a diagram for explaining scanning with an electron probe.

FIG. 2 is a diagram for illustrating the scanning with the electron probe in the Auger electron microscope 100.

In the Auger electron microscope 100, the electrons emitted from the electron source 21 are focused by the condenser lens 22 and the objective lens 26 to form the electron probe, and the electron beam is deflected with the scanning deflector 25 to scan the specimen S with the electron probe. By scanning the specimen S with the electron probe, analyzing the Auger electrons emitted from each point on the specimen S with the electron analyzer 50, and detecting the Auger electrons with the Auger electron detector 60, it is possible to acquire the Auger image. Additionally, by detecting the secondary electrons emitted from each point on the specimen S with the secondary electron detector 70, it is possible to acquire the secondary electron image.

In the Auger electron microscope 100, as illustrated in FIG. 2, an observation region S2 of the specimen S is raster-scanned. For example, as illustrated in FIG. 2, the scanning with the electron probe is performed by repetitively drawing a scanning line L along an X-axis and moving a position at which the scanning line L is to be drawn along a Y-axis. For example, to obtain a 256×256 pixel scanning image, 256 scanning lines L are drawn. In the Auger electron microscope 100, for example, the observation region S2 is scanned a plurality of times, and intensities of signals at individual pixels are integrated to acquire the scanning image.

1.2. Operation

Figure 3:
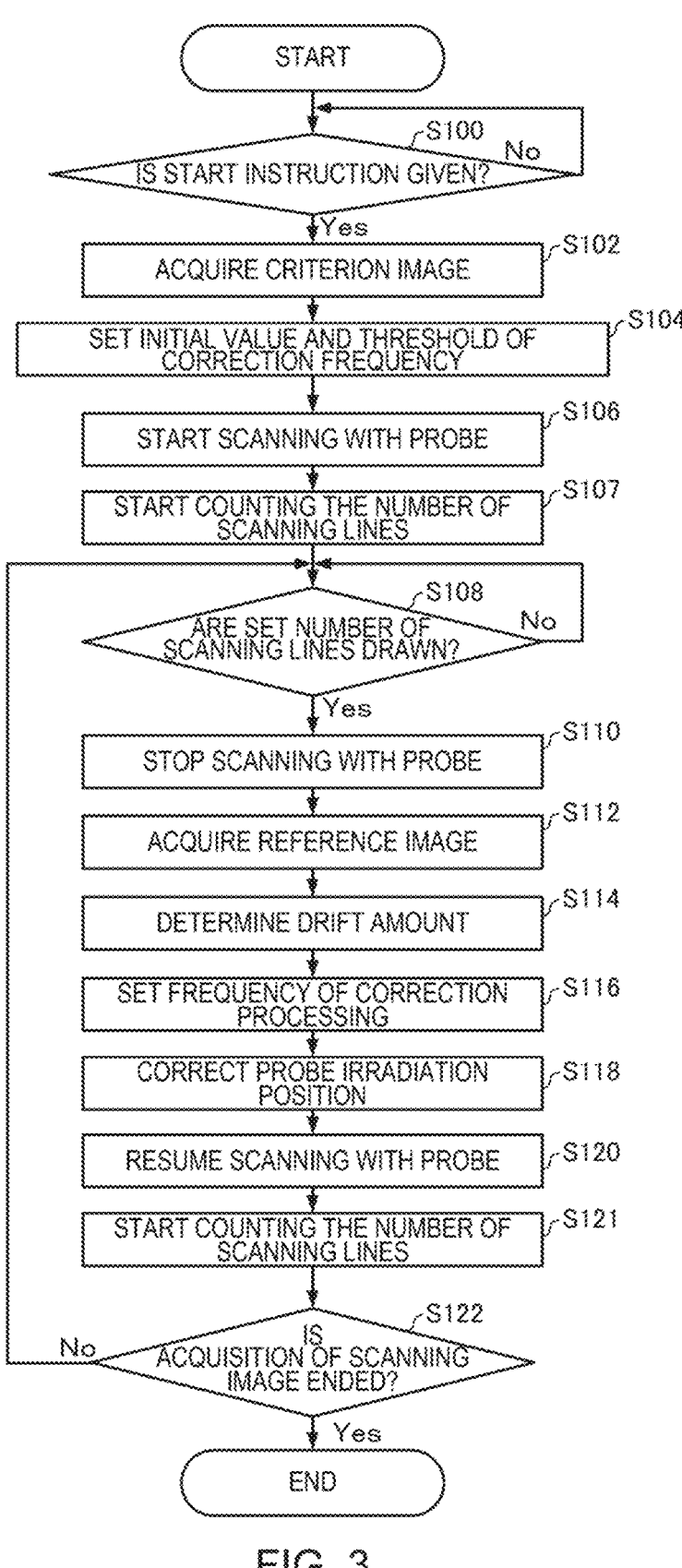
FIG. 3 is a flow chart illustrating an example of processing in a control unit of the Auger electron microscope according to the first embodiment.

Next, a description will be given of an operation of the Auger electron microscope 100. FIG. 3 is a flow chart illustrating an example of processing in the control unit 80 of the Auger electron microscope 100 according to the first embodiment. A description will be given herein of an operation when the Auger electron microscope 100 acquires the Auger image.

In the Auger electron microscope 100, the control unit 80 performs the correction processing of acquiring a reference image obtained by scanning the specimen S with the probe, comparing the reference image to a criterion image to determine a drift amount D, and correcting a displacement of a probe irradiation position on the specimen S based on the drift amount D and processing S116 of setting a frequency with which the correction processing is to be performed based on the drift amount. As illustrated in FIG. 3, the correction processing includes processing S112 of acquiring the reference image, processing S114 of determining the drift amount D, and processing S118 of correcting the probe irradiation position.

Before the control unit 80 performs the processing of acquiring the Auger image, a user sets conditions (an acceleration voltage and a probe current) for the optical system 20 and conditions for the electron analyzer 50, each for acquiring the Auger image. The user operates a setting unit (such as a user interface) of the control unit 80 to set these conditions. The setting of these conditions in the setting unit is reflected on processing in the control unit 80.

In addition, the user determines the observation region S2 on the specimen S. For example, the user acquires a secondary electron image of the specimen S in the Auger electron microscope 100, observes the specimen S, and determines the observation region S2.

After determining the conditions for the optical system 20, the conditions for the electron analyzer 50, and the observation region S2, the user gives an instruction to start the acquisition of the Auger image to the Auger electron microscope 100.

The control unit 80 determines whether or not the user has given the instruction to start the acquisition of the Auger image (S100). When an operation of pressing a start button is performed or when the start instruction is input to an input device, the control unit 80 determines that the user has given the start instruction.

When determining that the user has given the start instruction (Yes in S100), the control unit 80 acquires the criterion image (S102).

The criterion image is an image serving as a criterion in the processing of determining the drift amount D. The control unit 80 acquires the secondary electron image photographed on the observation region S2 of the specimen S, and uses the secondary electron image as the criterion image. The criterion image may also be an image of the observation region S2 photographed in advance. Note that the criterion image may also be either the backscattered electron image or the Auger image.

Then, the control unit 80 sets an initial value $A_0$ of the frequency with which the correction processing is to be performed and a threshold T of the drift amount D (S104).

The initial value $A_0$ is set as the number of the scanning lines after the scanning with the probe is started until the correction processing is performed. In other words, the correction processing is performed at the timing at which the number of scanning lines set as the initial value $A_0$ are drawn.

The threshold T is the allowable drift amount D. The initial value $A_0$ and the threshold T are, for example, optional values set in advance. Note that the user may also set the initial value $A_0$ and the threshold T.

Then, the control unit 80 starts the scanning with the probe for acquiring the Auger image (S106). The control unit 80 causes the optical system 20 to start the scanning with the probe.

When the scanning with the probe is started, the control unit 80 starts counting the number of the scanning lines drawn on the specimen S (S107), and determines whether or not the set number A ($A=A_0$) of scanning lines are drawn (S108).

For example, when the set initial value $A_0$ is 64, the control unit 80 determines that the set number A of scanning lines are drawn when the 64th scanning line is drawn after the scanning with the probe is started.

When determining that the set number A of scanning lines are drawn (Yes in S108), the control unit 80 stops the scanning with the probe (S110). In other words, the control unit 80 causes the optical system 20 to stop the scanning with the probe. Thus, the scanning with the probe for acquiring the Auger image is interrupted.

Then, the control unit 80 starts the correction processing. First, the control unit 80 acquires the reference image (S112). The control unit 80 causes the optical system 20 to perform the scanning with the probe for acquiring the reference image (secondary electron image) to acquire data on the reference image from the secondary electron detector 70.

The control unit 80 compares the reference image acquired in the processing S112 to the criterion image acquired in the processing S102 to determine the drift amount D (S114). The control unit 80 determines a magnitude of a deviation between the reference image and the criterion image and a direction of the deviation by, e.g., pattern matching. The control unit 80 determines the drift amount D and a direction of a drift from the magnitude of the deviation and the direction of the deviation. Alternatively, it may also be possible to perform Fourier transform on each of the criterion image and the reference image, determine a correlation function between a result of the Fourier transform performed on the criterion image and a result of the Fourier transform performed on the reference image, and determine the drift amount D and the direction of the drift.

The deviation between the reference image and the criterion image results from fluctuations (drift) of relative positions of the electron beam and the specimen with time. The deviation between the reference image and the criterion image results from, e.g., a drift of the specimen S due to a temperature change, charging, or the like or a drift of the probe irradiation position due to a temperature change in the optical system 20 or the like. In other words, the drift amount D is an amount of fluctuations of relative positions of the optical system 20 and the specimen S.

The control unit 80 corrects a displacement of the probe irradiation position on the specimen S based on the drift amount D (S118). The control unit 80 operates the optical system based on the drift amount D and the direction of the drift so as to cancel the drift. For example, the correction of the irradiation position is performed by causing the deflector 24 to deflect the electron beam and thereby moving the probe irradiation position by the drift amount D in a direction opposite to a drift direction. After correcting the displacement of the probe irradiation position, the control unit 80 ends the correction processing.

Before the processing S118 is performed, the control unit 80 sets the frequency with which the correction processing is to be performed based on the drift amount D determined in the processing S114 (S116).

Specifically, the control unit 80 sets the number A of the scanning lines to be drawn in a period between the end of the correction processing and the start of the subsequent correction processing.

The control unit 80 sets the frequency with which the correction processing is to be performed higher as the drift amount D is larger and sets the frequency with which the correction processing is to be performed lower as the drift amount D is smaller. In other words, the control unit 80 sets the number A of the scanning lines smaller as the drift amount D is larger and sets the number A of the scanning lines larger as the drift amount D is smaller. The frequency is set as, e.g., an interval after the i-th (i is a natural number) correction processing is performed before the (i+1)-th correction processing is performed.

For example, the number $A_i$ of the scanning lines in the i-th frequency setting processing can be determined using the following formula.

$$A_i = A_0 \ (i=1)$$

$$A_i = A_{i-1} \times T/D \ (i \geq 2)$$

Note that $A_{i-1}$ is the number A of the scanning lines set in the (i–1)-th setting processing S116.

For example, when the number A of the scanning lines is set to 64, the control unit 80 performs the correction processing, and then performs the subsequent correction processing at the timing at which scanning corresponding to 64 lines is performed. To obtain the 256×256 pixel image, 256 scanning lines are drawn, and accordingly, when the number A of the scanning lines is set to 64, correction is performed four times while the observation region S2 is scanned once.

The threshold T indicates an allowable value of the drift amount D. For example, in the case where the Auger image is a 256×256 pixel image at a 100,000-fold magnification, when an image size is assumed to be 120 mm×120 mm, a size of one pixel is 120 mm÷105÷256 pixel=4.7×10⁻⁶ mm/pixel, and is about 5 nm/pixel. Accordingly, when the threshold T is set to 10 nm, the setting does not allow a drift of not less than 2 pixels while the 256×256 pixel image is acquired.

For example, when the previously set number A of the scanning lines is 64, the drift amount D is 20 nm, and the threshold T is 10 nm, the number A of the scanning lines satisfies $A_i = A_{i-1} \times T/D = 64 \times 10/20 = 32$, and the number A of the scanning lines is set to 32.

Meanwhile, when, e.g., the previously set number A of the scanning lines is 64, the drift amount D is 5 nm, and the threshold T is 10 nm, the number A of the scanning lines satisfies $A_i = A_{i-1} \times T/D = 64 \times 10/5 = 128$, and the number A of the scanning lines is set to 128.

Note that the foregoing has described the case where, after the processing S116, the processing S118 is performed, but the processing S116 and the processing S118 may also be performed concurrently, or the processing S116 may also be performed after the processing S118.

After the correction processing is ended, the control unit 80 presumes the scanning with the probe for acquiring the Auger image (S120). The control unit 80 causes the scanning deflector 25 to start the scanning with the probe. For example, when the scanning with the probe is stopped at the 64th line in the processing S110, the scanning with the probe is resumed at the 65th line.

When the scanning with the probe is resumed, the control unit 80 starts counting the number of the scanning lines drawn on the specimen S (S121).

The control unit 80 determines whether or not to end the acquisition of the Auger image (S122). The control unit 80 determines that the acquisition of the Auger image is to be ended when, e.g., the observation region S2 is scanned with the probe by the preset number of integrations. For example, when the number of integrations is set to 10, the control unit 80 determines that the acquisition of the Auger image is to be ended when the observation region S2 is scanned ten times.

When determining that the acquisition of the Auger image is not to be ended (No in S122), the control unit 80 returns to the processing S108 and determines whether or not the set number A of scanning lines are drawn (S108). At this time, when the number A of the scanning lines is set to 32 in the processing S116, the control unit 80 determines that the set number of scanning lines are drawn when the 32nd scanning line is drawn after the scanning with the probe is resumed. Meanwhile, when the number A of the scanning lines is set to, e.g., 128 in the processing S116, the control unit 80 determines that the set number of scanning lines are drawn when the 128th scanning line is drawn after the scanning with the probe is resumed.

When determining that the set number A of scanning lines are drawn (Yes in S108), the control unit 80 stops the scanning with the probe (S110), and starts the correction processing. The control unit 80 acquires the reference image (S112), and compares the reference image to the criterion image to determine the drift amount D (S114). The control unit 80 sets the number A of the scanning lines based on the drift amount D (S116), and corrects the displacement of the probe irradiation position on the specimen S based on the drift amount D (S118). After ending the correction processing, the control unit 80 resumes the scanning with the probe (S120), and starts counting the number of the scanning lines (S121). Then, the control unit 80 determines whether or not to end the acquisition of the Auger image (S122).

In this manner, the control unit 80 repeats the processing S108, the processing S110, the processing S112, the processing S114, the processing S116, the processing S118, the processing S120, the processing S121, and the processing S122 until it is determined that the acquisition of the Auger image is to be ended. Thus, while the Auger image is acquired, the control unit 80 repeats the setting of the frequency of the correction processing and the correction processing.

When determining that the acquisition of the Auger image is to be ended (Yes in S122), the control unit 80 ends the processing. In this manner, the Auger image of the observation region S2 can be acquired.

1.3. Effect

In the Auger electron microscope 100, the control unit 80 sets the frequency with which the correction processing is to be performed based on the drift amount D. Thus, in the Auger electron microscope 100, the frequency of the correction processing is set based on the drift amount D, and consequently the frequency of the correction processing can appropriately be set.

In addition, in the Auger electron microscope 100, the control unit 80 repetitively performs the processing S116 of setting the frequency of the correction processing and the correction processing (the processing S112, the processing S114, and the processing S118). As a result, in the Auger electron microscope 100, the frequency can be changed during analysis for acquiring the Auger image and therefore, even when the drift amount D significantly fluctuates during the analysis, the correction processing can be performed with an appropriate frequency.

Note that a drift of the specimen, stability of the optical system, and the like cannot precisely be predicted before measurement is started. Accordingly, it is difficult to set the frequency of the correction processing in advance before the measurement. For example, when the frequency with which the probe irradiation position is to be corrected is low relative to the drift amount D, the deviation between the reference image and the criterion image increases, and the deviation between the two images may not be able to be determined. Meanwhile, when the frequency with which the probe irradiation position is to be corrected is high relative to the drift amount D, the measurement takes time.

In the Auger electron microscope 100, as described above, the control unit 80 performs the processing S116 of setting the frequency of the correction processing, and consequently a problem as described above does not occur.

In the Auger electron microscope 100, the control unit 80 sets the number A of the scanning lines to be drawn in a period between the end of the correction processing and the start of the subsequent correction processing. Therefore, in the Auger electron microscope 100, it is possible to appropriately set the frequency of the correction processing.

2. Second Embodiment

2.1. Auger Electron Microscope.

Next, a description will be given of the Auger electron microscope according to the second embodiment. A configuration of the Auger electron microscope according to the second embodiment is the same as the configuration of the Auger electron microscope 100 illustrated in FIG. 1, and therefore a description thereof is omitted.

2.2. Operation

Next, a description will be given of an operation of the Auger electron microscope 100 according to the second embodiment. The following will describe a point different from that in the example of the operation of the Auger electron microscope 100 according to the first embodiment described above, and a description of the same points is omitted.

In the first embodiment described above, the control unit 80 sets, as the frequency, the number A of the scanning lines to be drawn in a period between the end of the correction processing and start of the subsequent correction processing. By contrast, in the second embodiment, the control unit 80 sets, as the frequency, a time period after the correction processing is ended until the subsequent correction processing is performed.

Figure 4:
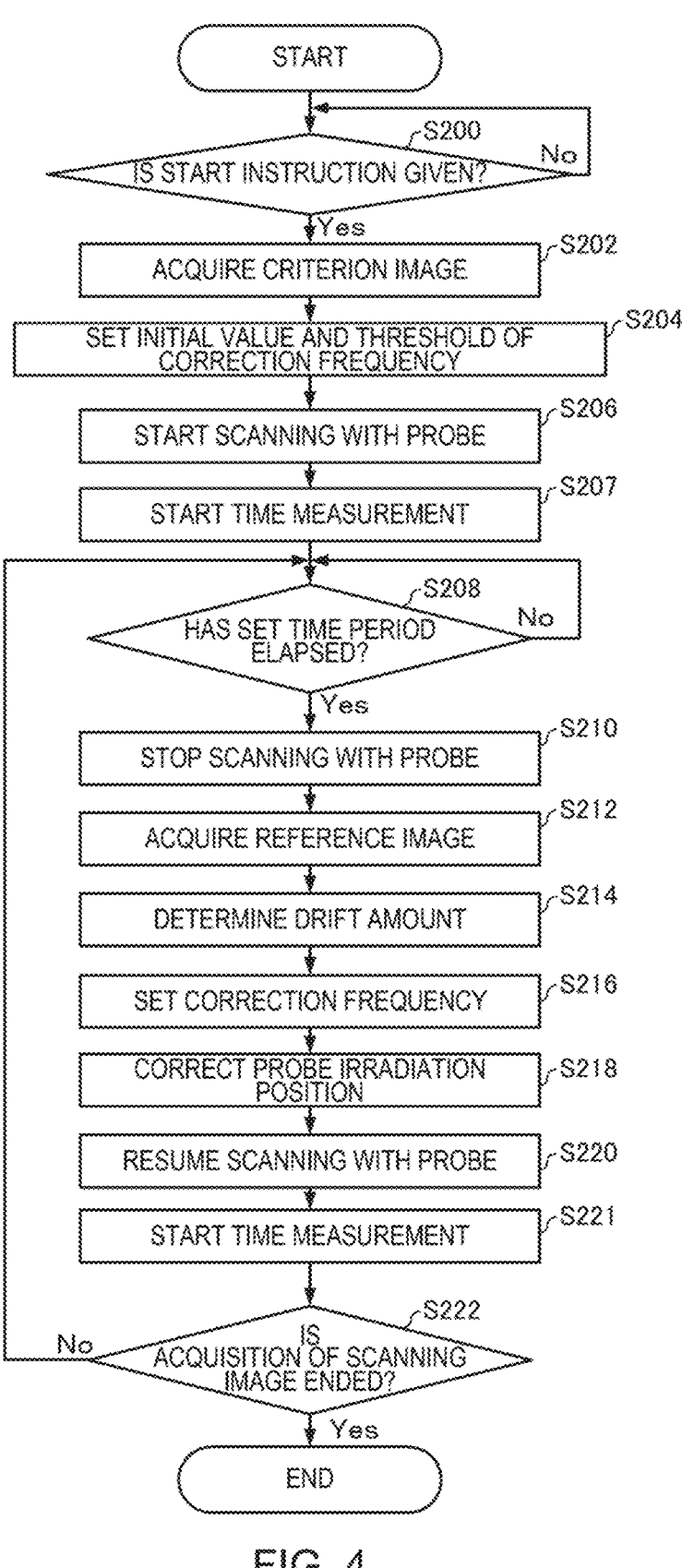
FIG. 4 is a flow chart illustrating an example of processing in the control unit of the Auger electron microscope according to the second embodiment.

FIG. 4 is a flow chart illustrating an example of processing in the control unit 80 of the Auger electron microscope 100 according to the second embodiment.

The control unit 80 determines whether or not the user has given an instruction to start the acquisition of the Auger image (S200). When determining that the start instruction is given (Yes in S200), the control unit 80 acquires the criterion image (S202).

Then, the control unit 80 sets an initial value $B_0$ of the frequency with which the correction processing is to be performed and the threshold T of the drift amount (S204). The initial value $B_0$ and the threshold T are, e.g., optional values set in advance. Note that the user may also set the initial value $B_0$ and the threshold T.

The initial value $B_0$ is set as a time period after the scanning with the probe is started until the first correction processing is performed. In other words, the correction processing is performed at the timing after a lapse of a time period corresponding to the initial value $B_0$ since the scanning with the probe is started. The threshold T is set in the same manner as in the processing S104 illustrated in FIG. 3.

Then, the control unit 80 starts the scanning with the probe for acquiring the Auger image (S206). When the scanning with the probe is started, the control unit 80 starts time measurement (S207), and determines whether or not a set time period B ($B=B_0$) has elapsed (S208).

For example, when the initial value $B_0$ is 30 seconds, the control unit 80 determines that the set time period B has elapsed when 30 seconds have elapsed since the scanning with the probe is started.

The control unit 80 stops the scanning with the probe (S210) when determining that the set time period B has elapsed (Yes in S208).

Next, the control unit 80 starts the correction processing. First, the control unit 80 acquires the reference image (S212), and compares the reference image to the criterion image to determine the drift amount D (S214). The control unit 80 corrects the displacement of the probe irradiation position on the specimen S based on the drift amount D (S218). In this manner, the correction processing can be performed.

Before the processing S218 is performed, the control unit 80 sets the frequency with which the correction processing is to be performed based on the drift amount D determined in the processing S214 (S216).

Specifically, the control unit 80 sets the time period B between the end of the correction processing and the start of the subsequent correction processing is performed.

The control unit 80 sets the frequency with which the correction processing is to be performed higher as the drift amount D is larger, and sets the frequency with which the correction processing is to be performed lower as the drift amount D is smaller. In other words, the control unit 80 sets the time period B shorter as the drift amount D is larger, and sets the time period B longer as the drift amount D is smaller.

For example, a time period $B_i$ in processing of setting the i-th frequency can be determined using the following formula.

$$B_i = B_0 \ (i=1)$$

$$B_i = B_{i-1} \times T/D \ (i \geq 2)$$

Note that $B_{i-1}$ is the time period B set in the (i−1)-th setting processing S216.

For example, when the previously set time period B is 30 seconds, the drift amount D is 20 nm, and the threshold T is 10 nm, the time period B satisfies $B_i = B_{i-1} \times T/D = 30 \times 10/20 = 15$, and the time period B is set to 15 seconds.

Meanwhile, when, e.g., the previously set time period B is 30 seconds, the drift amount D is 5 nm, and the threshold T is 10 nm, the time period B satisfies $B_i = B_{i-1} \times T/D = 30 \times 10/5 = 60$, and the time period B is set to 60 seconds.

Note that the description has been given above of the case where the processing S218 is performed after the processing S216, but the processing S216 and the processing S218 may also be performed concurrently, or the processing S216 may also be performed after the processing S218.

After the correction processing is ended, the control unit 80 presumes the scanning with the probe for acquiring the Auger image (S220), and starts the time measurement (S221). Then, the control unit 80 determines whether or not to end the acquisition of the Auger image (S222).

When determining that the acquisition of the Auger image is not to be ended (No in S222), the control unit 80 returns to the processing S208 and determines whether or not the set time period B has elapsed (S208). At this time, when the set time period B is set to 15 seconds in the processing S216, the control unit 80 determines that the time period B has elapsed after 15 seconds from the resumption of the scanning with the probe. Meanwhile, when, e.g., the time period B is set to 60 seconds in the processing S216, the control unit 80 determines that the time period B has elapsed after 60 seconds from the resumption of the scanning with the probe.

When determining that the time period B has elapsed (Yes in S208), the control unit 80 stops the scanning with the probe (S210), and starts the correction processing. The control unit 80 acquires the reference image (S212), and compares the reference image to the criterion image to determine the drift amount D (S214). The control unit 80 sets the set time period B based on the drift amount D (S216), and corrects the displacement of the probe irradiation position on the specimen S based on the drift amount D (S218). After ending the correction processing, the control unit 80 resumes the scanning with the probe (S220), and starts measurement of the time period B (S221). Then, the control unit 80 determines whether or not to end the acquisition of the Auger image (S222).

Thus, the control unit 80 repeats the processing S208, the processing S210, the processing S212, the processing S214, the processing S216, the processing S218, the processing S220, the processing S221, and the processing S222 until it is determined that the acquisition of the Auger image is to be ended.

When determining that the acquisition of the Auger image is to be ended (Yes in S222), the control unit 80 ends the processing. In this manner, the Auger image of the observation region S2 can be acquired.

2.3. Effect

In the Auger electron microscope 100 according to the second embodiment, the control unit 80 sets the time period B after the correction processing is ended until the subsequent correction processing is performed. Therefore, in the Auger electron microscope 100 according to the second embodiment, it is possible to appropriately set the frequency of the correction processing.

In the Auger electron microscope 100 according to the second embodiment, the same operation and effect as those achieved in the Auger electron microscope 100 according to the first embodiment described above can be achieved.

3. Third Embodiment

3.1. Auger Electron Microscope

Next, a description will be given of the Auger electron microscope according to the third embodiment. A configuration of the Auger electron microscope according to the third embodiment is the same as the configuration of the Auger electron microscope 100 illustrated in FIG. 1, and therefore a description thereof is omitted.

3.2. Operation

Next, a description will be given of an operation of the Auger electron microscope 100 according to the third embodiment. The following will describe a point different from that in the example of the operation of the Auger electron microscope 100 according to the first embodiment described above, and a description of the same points is omitted.

In the first embodiment described above, the control unit 80 sets, as the frequency, the number A of the scanning lines to be drawn in a period between the end of the correction processing and the start of the subsequent correction processing. By contrast, in the third embodiment, the control unit 80 sets a dwell time period C per pixel for the probe, and performs the correction processing after the observation region S2 is scanned with the probe and before the observation region S2 is subsequently scanned with the probe. For example, the control unit 80 performs the correction processing every time the entire observation region S2 is scanned, and changes the dwell time period C to change the frequency of the correction processing.

Figure 5:
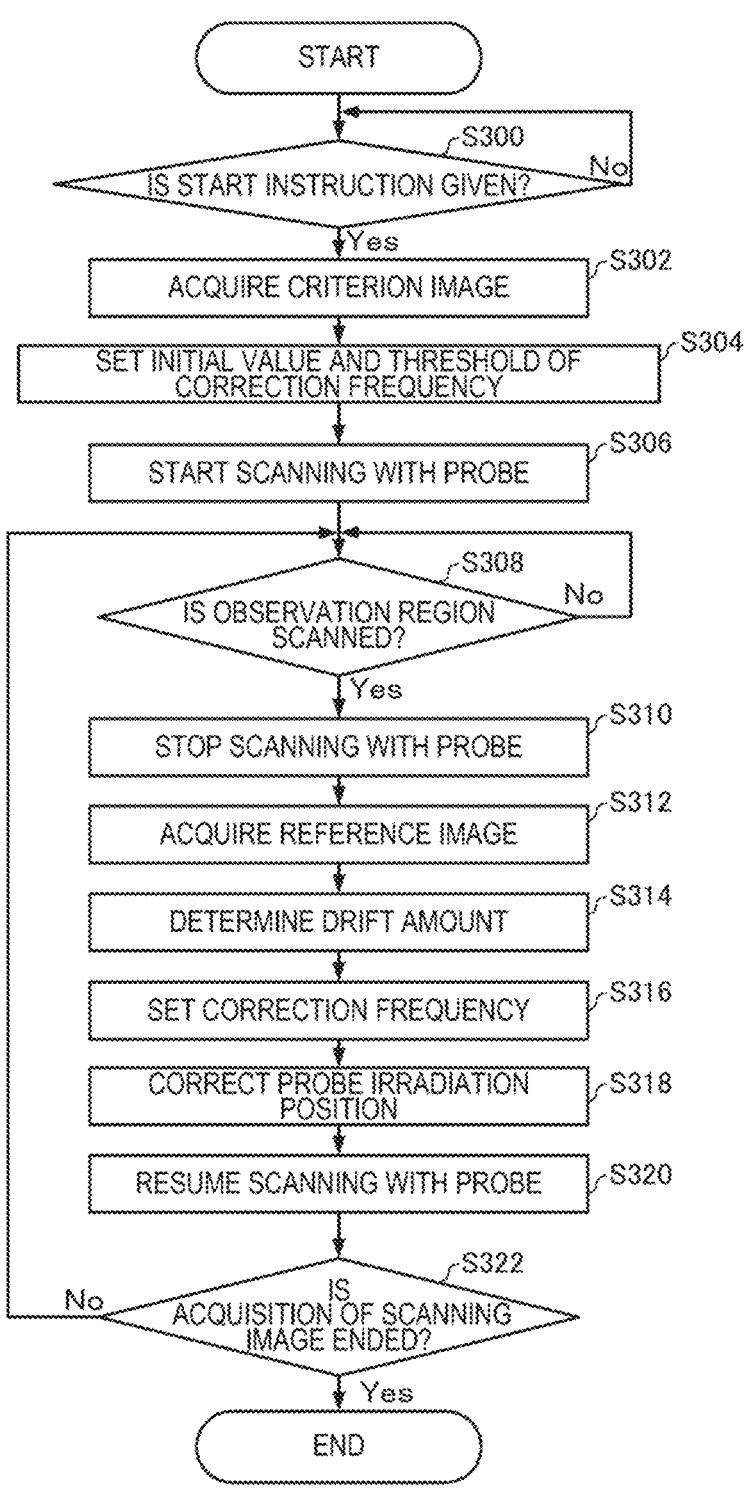
FIG. 5 is a flow chart illustrating an example of processing in the control unit of the Auger electron microscope according to the third embodiment.

FIG. 5 is a flow chart illustrating an example of processing in the control unit 80 of the Auger electron microscope 100 according to the third embodiment.

The control unit 80 determines whether or not the user has given an instruction to start the acquisition of the Auger image (S300). When determining that the start instruction is given (Yes in S300), the control unit 80 acquires the reference image (S302).

Then, the control unit 80 sets an initial value $C_0$ of the frequency with which the correction processing is to be performed and the threshold T of the drift amount (S304). The initial value $C_0$ and the threshold T are, e.g., optional values set in advance. Note that the user may also set the initial value $C_0$ and the threshold T.

The initial value $C_0$ is set as the probe dwell time period C per pixel. It is to be noted herein that, in the third embodiment, the correction processing is performed every time the observation region S2 is scanned once, and the frequency of the correction processing is set as the probe dwell time period C. By changing the probe dwell time period C, the scanning speed is changed, and a scanning time period during which the observation region S2 is scanned can be changed. Accordingly, by setting the probe dwell time period C, the frequency of the correction processing can be set. The threshold T is set in the same manner as in the processing S104 illustrated in FIG. 3.

Then, the control unit 80 starts the scanning with the probe for acquiring the Auger image (S306). The control unit 80 causes the scanning deflector 25 to scan the observation region S2 with the probe such that the dwell time period per pixel has the set initial value $C_0$. Thus, the scanning of the observation region S2 is started.

The control unit 80 determines whether or not the entire observation region S2 is scanned (S308). When determining that the entire observation region S2 is scanned (Yes in S308), the control unit 80 stops the scanning with the probe (S310).

For example, when the Auger image is a 256×256 pixel image and the initial value $C_0$ is $256^{-2}$ seconds, the scanning time period for the observation region S2 satisfies 256×256× $256^{-2=1}$ [second].

Then, the control unit 80 starts the correction processing. First, the control unit 80 acquires the reference image (S312), and compares the reference image to the criterion image to determine the drift amount D (S314). The control unit 80 corrects the displacement of the probe irradiation position on the specimen S based on the drift amount D (S318). In this manner, the correction processing can be performed.

Before the processing S318 is performed, the control unit 80 sets the frequency with which the correction processing is to be performed based on the drift amount D determined in the processing S314 (S316).

Specifically, the control unit 80 sets the probe dwell time period C per pixel.

The control unit 80 sets the frequency with which the correction processing is to be performed higher as the drift amount D is larger, and sets the frequency with which the correction processing is to be performed lower as the drift amount D is smaller. In other words, the control unit 80 sets the dwell time period C shorter as the drift amount D is larger, and sets the dwell time period C longer as the drift amount D is smaller.

For example, a dwell time period $C_i$ in the i-th frequency setting processing can be determined using the following formula.

$$C_i = C_0 \ (i=1)$$

$$C_i = C_{i-1} \times T/D \ (i \geq 2)$$

Note that $C_{i-1}$ is the time period C set in the (i–1)-th setting processing S316.

For example, when the previously set dwell time period C is $256^{-2}$ seconds, the drift amount D is 20 nm, and the threshold T is 10 nm, the dwell time period C is set to satisfy $C_i = C_{i-1} \times T/D = 256^{-2} \times 10/20$, and the scanning time period for the observation region S2 satisfies $256 \times 256 \times C_i = 0.5$ [seconds]. In other words, the correction processing is performed after 0.5 seconds.

Meanwhile, when, e.g., the previously set dwell time period C is $256^{-2}$ seconds, the drift amount D is 5 nm, and the threshold T is 10 nm, the dwell time period C is set to satisfy $C_i = C_{i-1} \times T/D = 256^{-2} \times 10/5$, and the scanning time period for the observation region S2 satisfies $256 \times 256 \times C_i = 2$ [seconds]. In other words, the correction processing is performed after 2 seconds.

Note that the foregoing has described the case where, after the processing S316, the processing S318 is performed, but the processing S316 and the processing S318 may also be performed concurrently, or the processing S316 may also be performed after the processing S318.

Then, the control unit 80 resumes the scanning with the probe for acquiring the Auger image (S320). The control unit 80 causes the optical system 20 to start the scanning with the probe for acquiring the Auger image. The control unit 80 causes the scanning deflector 25 to deflect the electron beam such that the dwell time period per pixel becomes the set dwell time period C.

Then, the control unit 80 determines whether or not to end the acquisition of the Auger image (S322).

When determining that the acquisition of the Auger image is not to be ended (No in S322), the control unit 80 returns to the processing S308, and determines whether or not the entire observation region S2 is scanned (S308). When determining that the entire observation region S2 is scanned (Yes in S308), the control unit 80 stops the scanning with the probe (S310), and resumes the correction processing. The control unit 80 acquires the reference image (S312), and compares the reference image to the criterion image to determine the drift amount D (S314). The control unit 80 sets the dwell time period C based on the drift amount D (S316), and corrects the displacement of the probe irradiation position on the specimen S based on the drift amount D (S318).

After the correction processing is ended, the control unit 80 resumes the scanning with the probe (S320), and determines whether or not to end the acquisition of the Auger image (S322).

Thus, the control unit 80 repeats the processing S308, the processing S310, the processing S312, the processing S314, the processing S316, the processing S318, the processing S320, and the processing S322 until it is determined that the acquisition of the Auger image is to be ended.

When determining that the acquisition of the Auger image is to be ended (Yes in S322), the control unit 80 ends the processing. In this manner, the Auger image of the observation region S2 can be acquired.

3.3. Effect

In the Auger electron microscope 100 according to the third embodiment, the scanning image is acquired through the scanning of the observation region S2 with the probe performed a plurality of times, the control unit 80 sets the probe dwell time period C per pixel, and performs the correction processing after the observation region S2 is scanned with the probe and before the observation region S2 is subsequently scanned with the probe. Thus, in the Auger electron microscope 100 according to the third embodiment, the dwell time period C is set according to the drift amount D, and therefore the scanning image can be acquired at an appropriate scanning speed.

Additionally, in the Auger electron microscope 100 according to the third embodiment, the correction processing is performed after the observation region S2 is scanned with the probe and before the observation region S2 is subsequently scanned with the probe. In other words, while the observation region S2 is scanned, the scanning with the probe is not interrupted. As a result, a more excellent scanning image of the observation region S2 can be obtained.

For example, when the scanning with the probe is interrupted during the scanning of the observation region S2, a displacement occurs after the scanning with the probe is interrupted, and an excellent scanning image may not be able to be obtained.

In the Auger electron microscope 100 according to the third embodiment, the same operation and effect as those achieved in the Auger electron microscope 100 according to the first embodiment described above can be achieved.

3.4. Modifications 3.4.1. First Modification

In the third embodiment described above, after stopping the scanning with the probe for acquiring the Auger image, the control unit 80 causes the optical system 20 to scan the observation region S2 with the probe to acquire the reference image (secondary electron image). By contrast, the control unit 80 may also acquire the reference image simultaneously with the acquisition of the Auger image.

As illustrated in FIG. 1, the Auger electron microscope 100 includes both of the Auger electron detector 60 for detecting the Auger electrons and the secondary electron detector 70, and can therefore simultaneously detect the Auger electrons and the secondary electrons. Accordingly, in the scanning with the probe for acquiring the Auger image, by detecting the Auger electrons with the Auger electron detector 60 and detecting the secondary electrons with the secondary electron detector 70, it is possible to simultaneously acquire the Auger image and the reference image.

3.4.2. Second Modification

In the third embodiment described above, as illustrated in FIG. 5, the processing of setting the frequency every time the observation region S2 is scanned once and the correction processing are performed, but the frequency setting processing and the correction processing may also be performed every time the observation region S2 is scanned N (N is an integer of not less than 2) times. For example, when N=3 is satisfied, the frequency setting processing and the correction processing are performed after the observation region S2 is scanned three times and before the fourth scanning is performed.

4. Others

Note that the invention is not limited to the embodiments described above, and can variously be modified and implemented within the scope of the gist of the invention.

For example, in the first to third embodiments described above, the description has been given of the case where the charged particle beam apparatus according to the invention is the Auger electron microscope, but the charged particle beam apparatus according to the invention only needs to be an apparatus that forms a probe with a charged particle beam such as an electron beam or an ion beam, and scans a specimen with the probe to acquire a scanning image. Alternatively, a signal generated from the specimen through scanning of the specimen with the probe may also be electrons such as secondary electrons, backscattered electrons, or Auger electrons or light such as an X-ray such as a characteristic X-ray or cathode luminescence.

The charged particle beam apparatus according to the invention may also be, e.g., a scanning electron microscope (SEM), a scanning transmission electron microscope (STEM), an electron probe microanalyzer (EPMA), or a focused ion beam apparatus (FIB).

For example, in the first to third embodiments described above, the description has been given of the case where the Auger image is to be acquired, but the charged particle beam apparatus according to the invention may also acquire various scanning images other than the Auger image. For example, the charged particle beam apparatus according to the invention may also acquire an element map by EDS (energy dispersive X-ray spectroscopy), may also acquire an electron map by WDS (wavelength-dispersive X-ray spectroscopy), or may also acquire an electron map by EELS (electron energy-loss spectroscopy).

For example, in the first to third embodiments described above, the description has been given of the case where, as each of the criterion image and the reference image, the secondary electron image is used, but each of the criterion image and the reference image is not limited to the secondary electron image, and may also be a backscattered electron image, an Auger image, the electron map resulting from the EDS, the electron map resulting from the EELS, or the like.

For example, in the first to third embodiments described above, the description has been given of the case where the frequency of the correction processing is set when the Auger image is to be acquired, i.e., when mapping analysis is to be performed. However, the invention is also applicable to the case where the frequency of the correction processing is set when line analysis or point analysis is to be performed.

The invention is not limited to the above-described embodiments, and various modifications can be made. For example, the invention includes configurations that are substantially the same as the configurations described in the embodiments. Substantially same configurations mean configurations having the same functions, methods and results, or configurations having the same objectives and effects as those of the configurations described in the embodiments, for example. The invention also includes configurations obtained by replacing non-essential elements of the configurations described in the embodiments with other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

What is claimed is:

1. A charged particle beam apparatus that forms a probe with a charged particle beam and scans a specimen with the probe to acquire a scanning image, the charged particle beam apparatus comprising:
    an optical system for scanning the specimen with the probe;
    a detector that detects a signal generated from the specimen through the scanning of the specimen with the probe; and
    a control unit that controls the optical system,
    the control unit performing:
    correction processing of acquiring a reference image obtained by the scanning of the specimen with the probe, comparing the reference image to a criterion image to determine a drift amount, and correcting a displacement of an irradiation position with the probe on the specimen based on the drift amount; and
    processing of setting a frequency with which the correction processing is to be performed, based on the drift amount, wherein the scanning image is acquired by integrating the signal obtained by scanning an observation region of the specimen with the probe a plurality of times, wherein the control unit performs the correction processing after the observation region has been scanned with the probe and before the observation region is subsequently scanned with the probe, and wherein the control unit sets the frequency of the correction processing by changing a dwell time period of the probe per pixel, based on the drift amount.

2. The charged particle beam apparatus according to claim 1, wherein the control unit repetitively performs the processing of setting the frequency and the correction processing.

3. The charged particle beam apparatus according to claim 1, wherein, in the processing of setting the frequency, the control unit sets the frequency higher as the drift amount is larger.

4. The charged particle beam apparatus according to claim 1, wherein, in the processing of setting the frequency, the control unit sets the frequency higher if the drift amount is larger than a threshold value and sets the frequency lower if the drift amount is smaller than a threshold value.

5. The charged particle beam apparatus according to claim 4, wherein, in the processing of setting the frequency, the control unit sets the dwell time period, $C_i$, in the i-th frequency setting processing using the following formula:

$$C_i = C_0 (i=1)$$

$$C_i = C_{i-1} \times T/D \ (i \geq 2)$$

wherein,
$C_0$ is the initial dwell time period;
D is the drift amount; and
T is the threshold.

* * * * *